United States Patent [19]

Saijo

[11] Patent Number: 5,361,008
[45] Date of Patent: Nov. 1, 1994

[54] SWITCHING CIRCUIT OF LOW POWER CONSUMPTION

[75] Inventor: Ryuichi Saijo, Tokyo, Japan
[73] Assignee: NEC Corporation, Tokyo, Japan
[21] Appl. No.: 25,751
[22] Filed: Mar. 3, 1993

[30] Foreign Application Priority Data

Mar. 3, 1992 [JP] Japan .................. 4-045109

[51] Int. Cl.$^5$ ............................................ H03K 17/10
[52] U.S. Cl. ...................................... 327/427; 327/77; 327/309
[58] Field of Search ........................ 307/571, 570, 296.5, 307/296.8, 494, 499, 544, 546, 562, 358

[56] References Cited

U.S. PATENT DOCUMENTS

| | | | |
|---|---|---|---|
| 4,540,893 | 9/1985 | Bloomer | 307/571 |
| 4,672,246 | 6/1987 | Donovan | 307/571 |
| 5,113,089 | 5/1992 | Osawa | 307/571 |

*Primary Examiner*—Timothy P. Callahan
*Assistant Examiner*—T. T. Lam
*Attorney, Agent, or Firm*—Sughrue, Mion, Zinn, Macpeak & Seas

[57] ABSTRACT

In a switching circuit comprising an output field effect transistor having an output drain electrode connected to a power supply through a load resistor and an output gate electrode supplied with an input voltage, a reference field effect transistor has a reference drain electrode connected to the power supply through a reference resistor and a reference gate electrode supplied with the input voltage. Each of the output and the reference field effect transistors is made of a metal oxide semiconductor. A comparator has a load input terminal connected to a load node of the output drain electrode and the load resistor and a reference input terminal connected to a reference node of the reference drain electrode and the reference resistor. The comparator compares a load sensing voltage from the load node with a reference voltage from the reference node to produce a compare output voltage when the load sensing voltage is higher than the reference voltage. A bias power circuit supplies a bias voltage to the output gate electrode and the reference gate electrode. A limiting circuit supplies a limiting voltage to the output gate electrode and the reference gate electrode when the limiting circuit is supplied with the compare output voltage. The limiting voltage is lower than the bias voltage.

6 Claims, 5 Drawing Sheets

SWITCHING CIRCUIT OF LOW POWER CONSUMPTION

BACKGROUND OF THE INVENTION

This invention relates to a switching circuit which comprises an output field effect transistor.

In the manner which will later be described more in detail, a conventional switching circuit comprises an output field effect transistor, a comparator, a bias power circuit, and a limiting circuit. The output field effect transistor has an output source electrode, an output drain electrode, and an output gate electrode. The output drain electrode is connected to a positive electrode of a power supply through a load resistor. The output source electrode is connected to a negative electrode of the power supply through a current sensing resistor. The output gate electrode is supplied with an input voltage.

The comparator has a load input terminal, a reference input terminal, and a compare output terminal. The load input terminal is connected to a load node of the output source electrode and the current sensing resistor. The reference input terminal is connected to a positive electrode of a first reference power supply. The load node has a load sensing voltage. The load input terminal is supplied with the load sensing voltage. The reference input terminal is supplied with a first reference voltage from the first reference power supply. The comparator compares the load sensing voltage with the first reference voltage to produce a compare output voltage when the load sensing voltage is higher than the first reference voltage.

The limiting circuit is connected to the compare output terminal and the output gate electrode. The limiting circuit supplies a limiting voltage to the output gate electrode when the limiting circuit is supplied with the compare output voltage. The limiting voltage is lower than the bias voltage.

Inasmuch as the load sensing resistor is in series connected to the output source electrode of the output field effect transistor, the conventional switching circuit has a high power consumption.

In the manner which will later be described more in detail, another conventional switching circuit comprises an output field effect transistor, a comparator, a bias power circuit, and a limiting circuit. The output field effect transistor has an output source electrode, an output drain electrode, and an output gate electrode. The output drain electrode is connected to a positive electrode of a power supply. The output source electrode is connected to a negative electrode of the power supply through a load resistor.

The comparator has a load input terminal, a reference input terminal, and a compare output terminal. The load input terminal is connected to a load node of the output source electrode and the load resistor. The reference input terminal is connected to a second negative electrode of a second reference power supply. The load node has a load sensing voltage. The load input terminal is supplied with the load sensing voltage. The reference input terminal is supplied with a second reference voltage from the second reference power supply. The comparator compares the load sensing voltage with the second reference voltage to produce a compare output voltage when the load sensing voltage is lower than the second reference voltage.

When the output gate electrode is, at a first time instant, supplied with the input voltage, a voltage of the reference input terminal becomes the second reference voltage at a second time instant which is later than the first time instant. The another conventional circuit can not detect an unreasonable current at the load resistor in a time from the first time instant to the second time instant. Consequently, the another conventional switching circuit needs a delay circuit which does not supply the compare output voltage to the limiting circuit in the time from the first time instant to the second time instant.

SUMMARY OF THE INVENTION

It is therefore an object of this invention to provide a switching circuit which has a low power consumption.

It is another object of this invention to provide a switching circuit which can at any time detect an unreasonable current at a load resistor.

It is a further object of this invention to provide a switching circuit which does not need a delay circuit.

Other objects of this invention will become clear as the description proceeds.

According to an aspect of this invention, there is provided a switching circuit which comprises (A) a signal input terminal supplied with an input voltage having a first level portion and a second level portion (B) an output field effect transistor having an output source electrode, an output drain electrode, and an output gate electrode, the output drain electrode being connected to a positive electrode of a power supply through a load resistor, the output field effect transistor being made of a metal oxide semiconductor, the output field effect transistor becoming on when the output gate electrode is supplied with a bias voltage; (C) a reference field effect transistor having a reference source electrode, a reference drain electrode, and a reference gate electrode, the reference drain electrode being connected to the power supply through a reference resistor, the reference field effect transistor being made of a metal oxide semiconductor, the reference field effect transistor becoming on when the reference gate electrode is supplied with the bias voltage; (D) a comparator having a load input terminal, a reference input terminal, and a compare output terminal, the load input terminal being connected to a load node of the output drain electrode and the load resistor, the reference input terminal being connected to a reference node of the reference drain electrode and the reference resistor, the load node having a load sensing voltage, the reference node having a reference voltage, the comparator being for comparing the load sensing voltage with the reference voltage to produce a compare output voltage when the load sensing voltage is higher than the reference voltage; (E) a bias power circuit connected to the output gate electrode, the reference gate electrode and the signal input terminal for producing the bias voltage when the bias power circuit is supplied with the first level portion of the input voltage and for supplying the bias voltage to the output gate electrode and the reference gate electrode; and (F) a limiting circuit connected to the compare output terminal, the output gate electrode, and the reference gate electrode for supplying a limiting voltage to the output gate electrode and the reference gate electrode when the limiting circuit is supplied with the compare output voltage, the limiting voltage being lower than the bias voltage, the output and the reference field effect transistors becoming off when the output and the reference gate electrodes are supplied with the limiting voltage.

According to another aspect of this invention, there is provided a switching circuit which comprises (A) a signal input terminal supplied with an input voltage having a first level portion and a second level portion; (B) an output field effect transistor having an output source electrode, an output drain electrode, and an output gate electrode, the output drain electrode being connected to a positive electrode of a power supply, the output source electrode being connected to a negative electrode of the power supply through a load resistor, the output field effect transistor being made of a metal oxide semiconductor, the output field effect transistor becoming on when the output gate electrode is supplied with a bias voltage; (C) a reference field effect transistor having a reference source electrode, a reference drain electrode, and a reference gate electrode, the reference drain electrode being connected to the positive electrode of the power supply, the reference source electrode being connected to the negative electrode of the power supply through a reference resistor, the reference field effect transistor being made of a metal oxide semiconductor, the reference field effect transistor becoming on when the reference gate electrode is supplied with the bias voltage; (D) a comparator having a load input terminal, a reference input terminal, and a compare output terminal, the load input terminal being connected to a load node of the output source electrode and the load resistor, the reference input terminal being connected to a reference node of the reference source electrode and the reference resistor, the load node having a load sensing voltage, the reference node having a reference voltage, the comparator being for comparing the load sensing voltage with the reference voltage to produce a compare output voltage when the load sensing voltage is lower than the reference voltage; (E) a bias power circuit connected to the output gate electrode, the reference gate electrode and the signal input terminal for supplying the bias voltage to the output gate electrode and the reference gate electrode; and (F) a limiting circuit connected to the compare output terminal, the output gate electrode, and the reference gate electrode for supplying a limiting voltage to the output gate electrode and the reference gate electrode when the limiting circuit is supplied with the compare output voltage the output and the reference field effect transistors becoming off when the output and the reference gate electrodes are supplied with the limiting voltage, the limiting voltage being lower than the bias voltage.

DESCRIPTION OF THE PREFERRED EMBODIMENT

Figure 1:
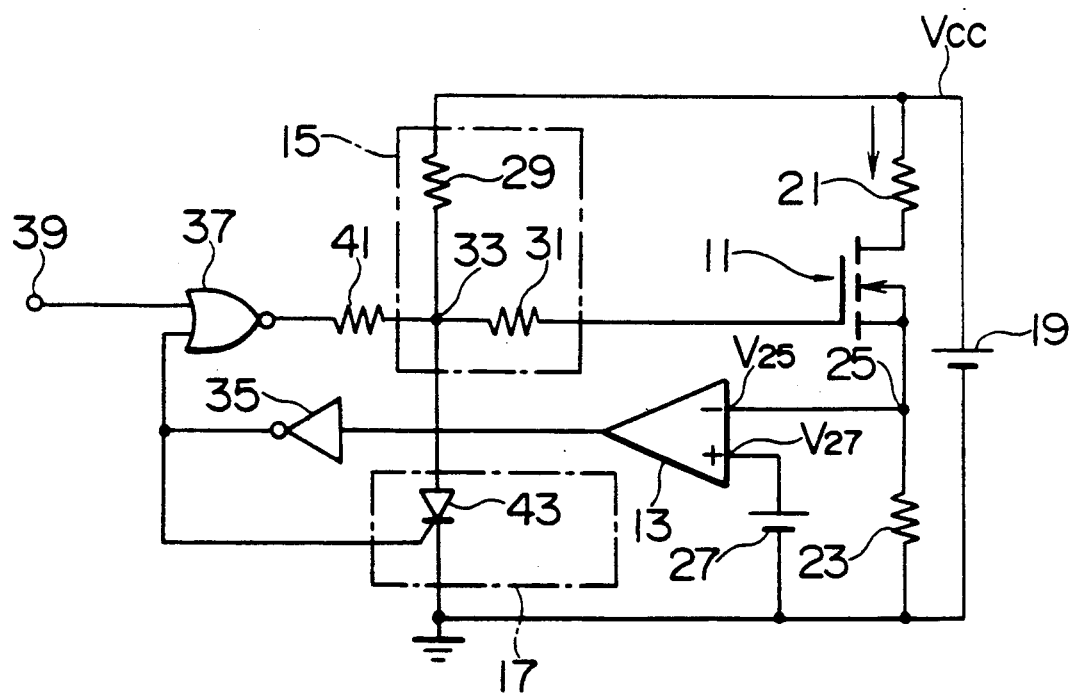
FIG. 1 is a circuit diagram of a conventional switching circuit.

Referring to FIG. 1, a conventional switching circuit will be described for a better understanding of this invention. The conventional switching circuit comprises an output field effect transistor 11, a comparator 13, a bias power circuit 15, and a limiting circuit 17.

The output field effect transistor 11 has an output source electrode, an output drain electrode, and an output gate electrode. The output drain electrode is connected to a positive electrode of a power supply 19 through a load resistor 21. The load resistor 21 is supplied with a load voltage Vcc from the power supply 19. The output source electrode is connected to a negative electrode of the power supply 19 through a current sensing resistor 23.

The comparator 13 has a load input terminal, a reference input terminal, and a compare output terminal. The load input terminal is connected to a first load node 25 of the output source electrode and the current sensing resistor 23. The first load node 25 has a first load sensing voltage V25 which is supplied from the power supply 19 to the load resistor 21. The load input terminal is supplied with the first load sensing voltage V25 from the load node 25. The reference input terminal is connected to a positive electrode of a first reference power supply 27. The reference input terminal is supplied with a first reference voltage V27 from the first reference power supply 27. The comparator 13 compares the first load sensing voltage V25 with the first reference voltage V27 to produce a compare output voltage when the load sensing voltage V25 is higher than the first reference voltage V27.

The bias power circuit 15 comprises a first resistor 29 and a second resistor 31. The first resistor 29 is connected to the positive electrode of the power supply 19. The second resistor 31 is connected between the first resistor 29 and the output gate electrode of the output field effect transistor 11. The second resistor 31 is connected to the first resistor 29 through a first bias node 33. The bias power circuit 15 supplies a first bias voltage Vb to the output gate electrode.

The compare output terminal of the comparator 13 is connected to an input terminal of a first inverter 35. An output terminal of the first inverter 35 is connected to a first input terminal of a NOR gate 37. A second input terminal of the NOR gate 37 is connected to a signal input terminal 39. The signal input terminal 39 is supplied with an input voltage. The input voltage has a low level portion and a high level portion. An output of the NOR gate 37 is connected to the first bias node 33 through a third resistor 41. The first inverter 35 produces a first inverted voltage when the first inverter 35 is not supplied with the compare output voltage from the comparator 13.

The NOR gate 37 supplies the input voltage to the output gate electrode through the third resistor 41 and the second resistor 31 when the NOR gate 37 is not supplied with the first inverted voltage from the first inverter 35.

The limiting circuit 17 comprises a thyristor 43 which is connected to the first bias node 33 and ground. A gate electrode of the thyristor 43 is connected to the output terminal of the first inverter 35. The thyristor 43 supplies a limiting voltage to the output gate electrode through the second resistor 31 when the thyristor 43 is supplied with the inverted voltage from the inverter 35. The limiting voltage is lower than the bias voltage.

Inasmuch as the load sensing resistor 23 is in series connected to output source electrode of the output field effect transistor 11, the conventional switching circuit has a high power consumption.

Figure 2:
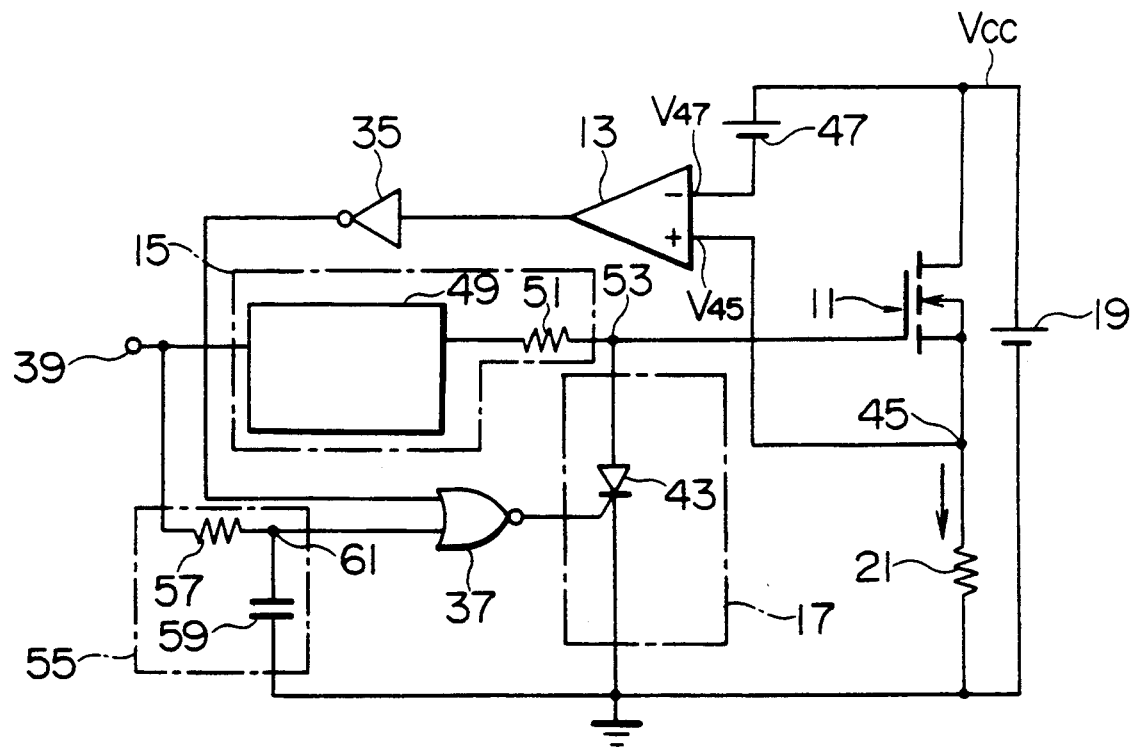
FIG. 2 is a circuit diagram of another conventional switching circuit.

Referring to FIG. 2, another conventional switching circuit will be described for a better understanding of this invention. Similar parts are designated by like reference numerals.

The load resistor 21 is connected between the output source electrode and the negative electrode of the power supply 19. The load input terminal of the comparator 13 is connected to a second load node 45 of the output source electrode and the load resistor 21. The second load node 45 has a second load sensing voltage V45. The load input terminal of the comparator 13 is supplied with the second load sensing voltage V45. The reference input terminal of the comparator 13 is connected to a negative electrode of a second reference power supply 47. The comparator 13 compares the second load sensing voltage V45 with the second reference voltage V47 to produce the compare output voltage when the second load sensing voltage V45 is lower than the second reference voltage V47.

The bias power circuit 15 comprises a charge pump circuit 49 and a fourth resistor 51. An input terminal of the charge pump circuit 49 is connected to the signal input terminal 39. The fourth resistor 51 is connected between an output gate electrode and an output terminal of the charge pump circuit 47. The fourth resistor 51 is connected to the output gate electrode through a second bias node 53.

The thyristor 43 is connected between the second bias node 53 and ground. The gate electrode of the thyristor 43 is connected to the NOR gate 37. The second input terminal of the NOR gate 37 is connected to the signal input terminal 39 through a delay circuit 55. The delay circuit 55 comprises a fifth resistor 57 and a first capacitor 59. The fifth resistor 57 and the first capacitor 59 are in series connected between the signal input terminal 39 and ground. The fifth resistor 57 is connected to the first capacitor 59 through a delay node 61. The second input terminal of the NOR gate 37 is connected to the delay node 61.

Figure 3:
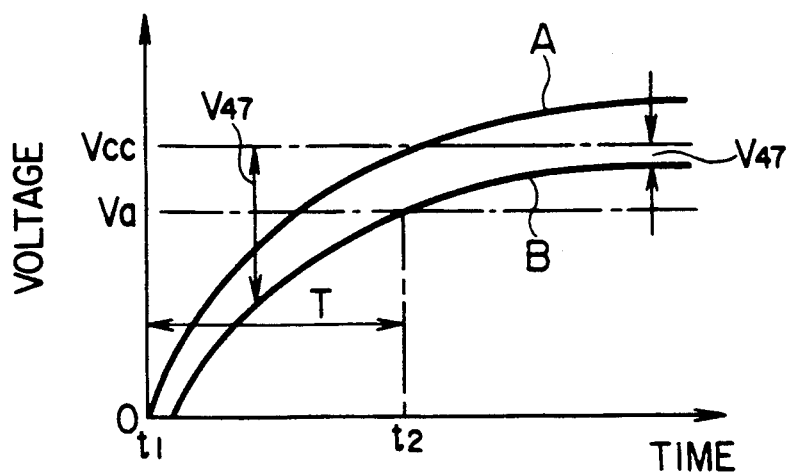
FIG. 3 is a graph for use in describing operation of the conventional switching circuit illustrated in FIG. 2.

Referring to FIG. 3, it is assumed that a voltage of the output gate electrode changes as shown by a curved line A after a first time instant $t_1$. The second load sensing voltage V45 changes as shown by a curved line B. The second reference voltage V47 is a remainder of the load voltage Vcc and the second load sensing voltage V45. The second load sensing voltage V45 is equal to a voltage Va at a second time instant $t_2$. The comparator 13 can not detect an unreasonable current at the load resistor 21 before the second load sensing voltage V45 is equal to the voltage Va. Therefore, the delay circuit 55 supplies a delay signal to the second input terminal of the NOR gate 37 in a time T from the first time instant $t_1$ to the second time instant $t_2$. The NOR gate 37 supplies the inverted voltage from the first inverter 35 to the gate electrode of the thyristor 43 when the NOR gate 37 is not supplied with the delay signal from the delay circuit 55.

Consequently, this conventional switching circuit can not detect the unreasonable current at the load resistor 21 and needs the delay circuit 55.

Figure 4:
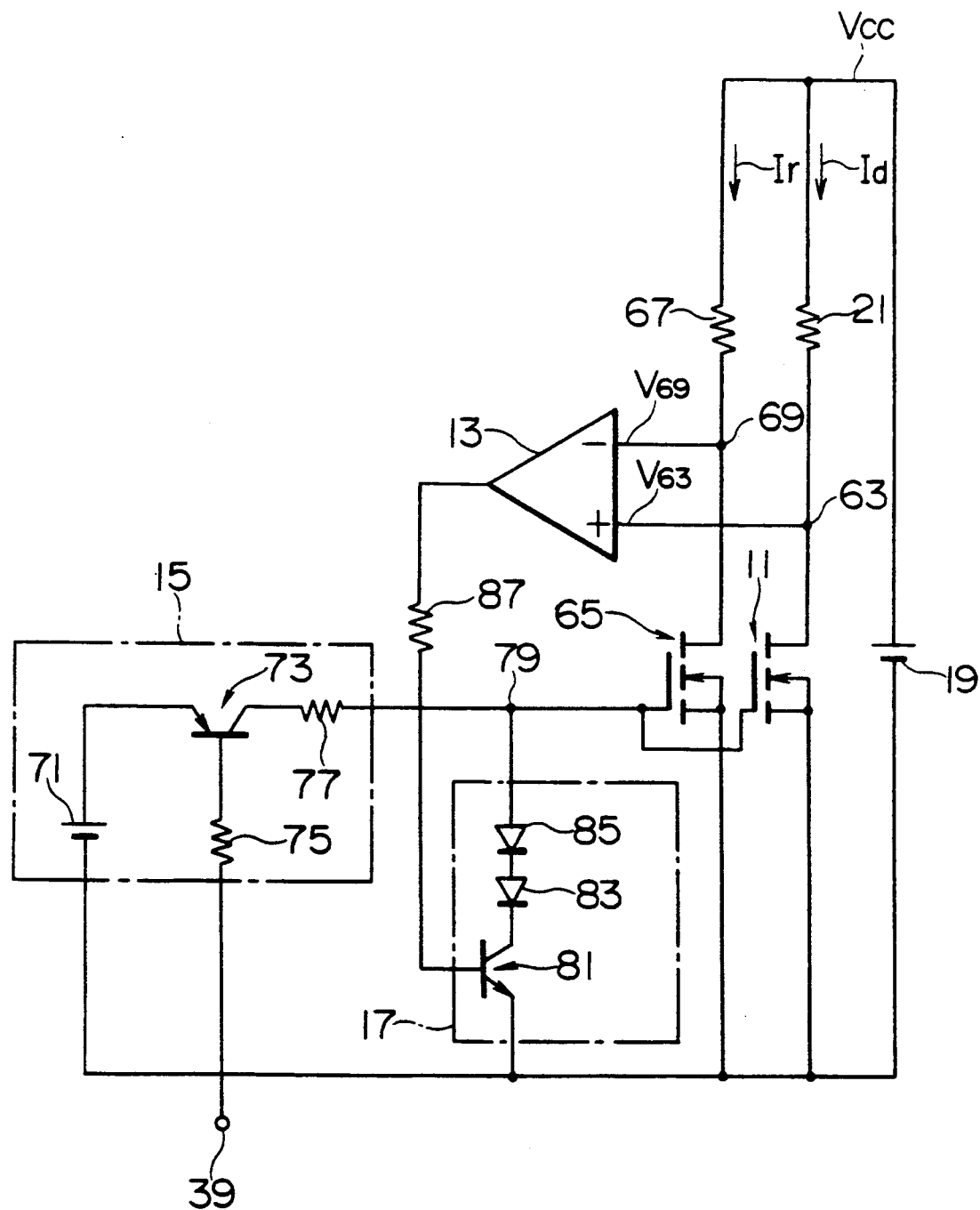
FIG. 4 is a circuit diagram of a switching circuit according to a first embodiment of this invention.

Referring to FIG. 4, the description will proceed to a switching circuit according to a first embodiment of this invention. Similar parts are designated by like reference numerals.

The output drain electrode of the output field effect transistor 11 is connected to the load resistor 21 through a third load node 63. A reference field effect transistor 65 is in parallel connected to the output field effect transistor 11 through a reference resistor 67. The reference resistor 67 is connected to the positive electrode of the power supply 19. The reference resistor 67 is connected to an output drain electrode of the reference field transistor 65 through a third reference node 69. Each of the output field effect transistor 11 and the reference field effect transistor 65 is made of a metal oxide semiconductor.

The power supply 19 causes a load current Id to flow from the positive electrode of the power supply 19 to the load resistor 21 and the output field effect transistor 11. The power supply 19 causes a reference current Ir to flow from the positive electrode of the power supply 19 to the reference resistor 67 and the reference field effect transistor 65. The third load node 63 has a third load sensing voltage V63. The third reference node 69 has a first reference voltage V69.

The third load sensing voltage V63 is lower than the third reference voltage V69 when the load current Id is lower than a predetermined current Ip. The third load sensing voltage V63 is higher than the third reference voltage V69 when the load current Id is higher than the predetermined current Ip.

The load input terminal of the comparator 13 is connected to the third load node 63 and supplied with the third load sensing voltage V63. The reference input terminal of the comparator 13 is connected to the third reference node 69 and supplied with the third reference voltage V69. The comparator 13 compares the third load sensing voltage V63 with the third reference voltage V69 to produce the compare output voltage when the third load sensing voltage V63 is higher than the third reference voltage V69.

The bias power circuit 15 comprises a bias power supply 71, a PNP transistor 73, a first bias resistor 75, and a second bias resistor 77. An emitter electrode of the PNP transistor 73 is connected to a positive electrode of the bias power supply 71. A gate electrode of the PNP transistor 73 is connected to the signal input terminal 39 through the first bias resistor 75. A collector electrode of the PNP transistor 73 is connected to the output gate electrode of the output field effect transistor 11 and a reference gate electrode of the reference field effect transistor 65 through the second bias resistor 77. The second bias resistor 77 is connected to the output gate electrode of the output field effect transistor 11 and the reference gate electrode of the reference field effect transistor 65 through a third bias node 79.

The bias power supply 71 produces and supplies the bias voltage to the output and the reference gate electrodes of the output and the reference field effect transistors 11 and 65 through the PNP transistor 73 and the second bias resistor 77 when the input voltage of the signal input terminal 39 has the low level portion. The output and the reference field effect transistors 11 and 65 become on when the output and the reference gate electrodes of the output and the reference field effect transistors 11 and 65 are supplied with the bias voltage.

The limiting circuit 17 comprises a NPN transistor 81, a first diode 83, and a second diode 85. An emitter of the NPN transistor 81 is connected to the negative electrode of the power supply 19. A collector of the NPN transistor 81 is connected to the third bias node 79 through the first and the second diodes 83 and 85. A gate electrode of the NPN transistor 81 is connected to the compare output terminal of the comparator 13 through a compare resistor 87.

The limiting circuit 17 supplies the limiting voltage $V_l$ to the output gate electrode of the output and the reference field effect transistors 11 and 65. The limiting voltage $V_l$ is lower than the bias voltage Vb. The output and the reference field effect transistors 11 and 65 become off when the output and the reference gate electrodes of the output and the reference field effect transistors 11 and 65 are supplied with the limiting voltage $V_l$.

Figure 5:
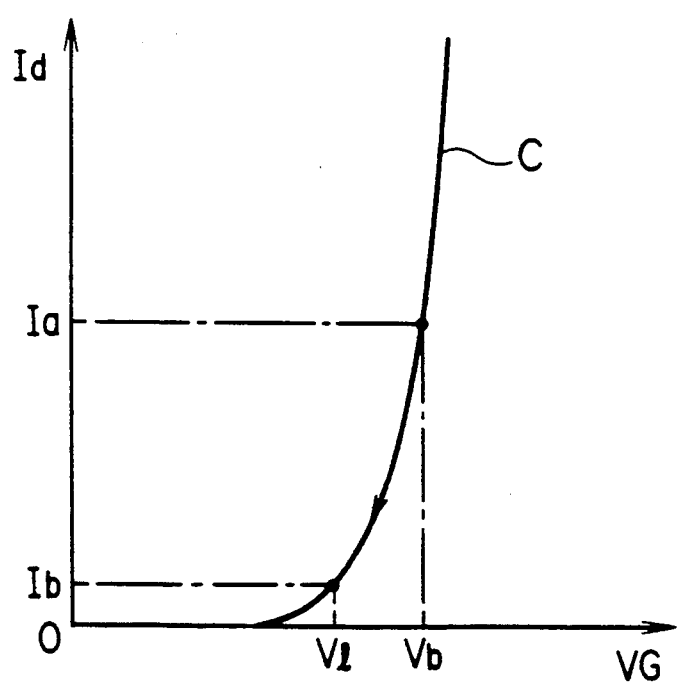
FIG. 5 is a graph for use in describing operation of the switching circuit illustrated in FIG. 4.

Referring to FIG. 5, the first load current Id changes as shown by a curved line C from a current Ia to a current Ib when a voltage $V_G$ at the output gate electrode of the output field effect transistor 11 changes from the bias voltage Vb to the limiting voltage $V_l$. The current Ib is lower than the current Ia.

Figure 6:
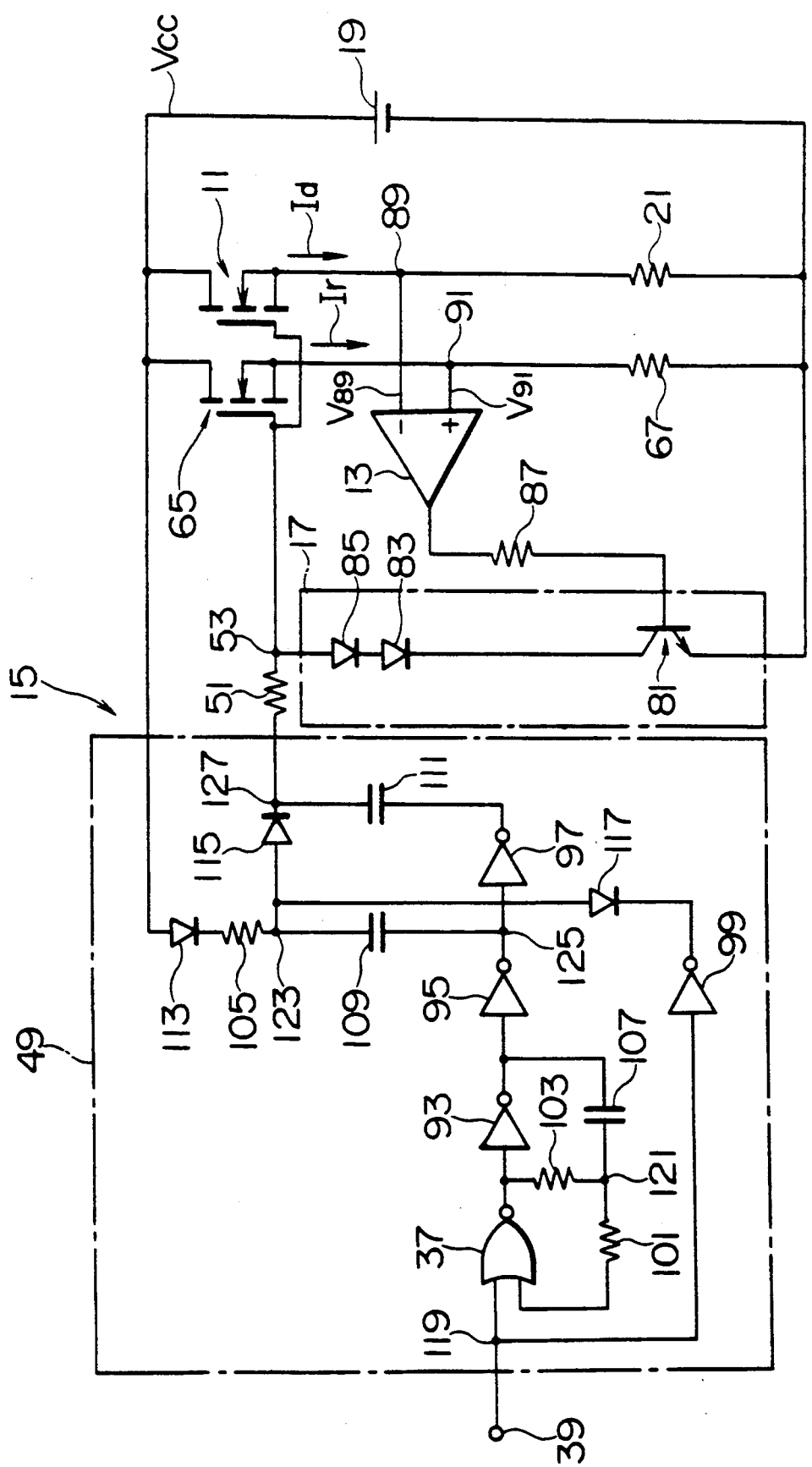
FIG. 6 is a circuit diagram of a switching circuit according to a second embodiment of this invention.

Referring to FIG. 6, the description will proceed to a switching circuit according to a second embodiment of this invention. Similar parts are designated by like reference numerals.

The output source electrode of the output field effect transistor 11 is connected to the negative electrode of the power supply 19 through the load resistor 21. The load resistor 21 is connected to the output source electrode of the output field effect transistor 11 through a fourth load node 89. The fourth load node 89 has a fourth load voltage V89. The reference source electrode of the reference field effect transistor 65 is connected to the negative electrode of the power supply 19 through the reference resistor 67. The reference resistor 67 is connected to the reference source electrode of the reference field effect transistor through a fourth reference node 91. The fourth reference node 91 has a fourth reference voltage V91.

The load input terminal of the comparator 13 is connected to the fourth load node 89 and supplied with the fourth load voltage V89. The reference input terminal of the comparator 13 is connected to the fourth reference node 91 and supplied with the fourth reference voltage V91. The comparator 13 compares the fourth load sensing voltage V89 with the fourth reference voltage V91 to produce the compare output voltage when the output and the reference field effect transistors 11 and 65 are on and when the fourth load voltage V89 is lower than the fourth reference voltage V91.

The bias power circuit 15 comprises the charge pump circuit 49 and the fourth resistor 51. The second bias node 53 is connected to the second limiting diode 85. The charge pump circuit 49 comprises the NOR gate 37, first through fourth charge inverters 93 to 99, first through third charge resistors 101 to 105, first through third charge capacitors 107 to 111, and first through third charge diodes 113 to 117.

The NOR gate 37, the first charge inverter 93, the second charge inverter 95, the second charge capacitor 109, the third charge resistor 105 and the first charge diode 113 are in series connected between the signal input terminal 39 and the positive electrode of the power supply 19. The second input terminal of the NOR gate 37 is connected to the signal input terminal 39 through a first charge node 119. The first and the second charge resistors 101 and 103 is in series connected between the first input terminal of the NOR gate 37 and an output terminal of the NOR gate 37. The first charge capacitor 107 is connected between an output terminal of the first charge inverter 93 and a second charge node 121 of the first charge resistor 101 and the second charge resistor 103.

The second charge diode 115 is connected between the fourth resistor 51 and a third charge node 123 of the second charge capacitor 109 and the third charge resistor 105. The fourth charge inverter 99 and the third charge diode 117 are in series connected between the first charge node 119 and the third charge node 123. The third charge inverter 97 and the third charge capacitor 111 are in series connected between an output terminal of the second charge diode 115 and a third charge node 125 of the second charge inverter 95 and the second charge capacitor 109.

What is claimed is:
1. A switching circuit comprising:
a signal input terminal for receiving an input voltage having a first level portion and a second level portion;
an output field effect transistor having an output source electrode, an output drain electrode, and an output gate electrode, said output drain electrode being connected to a positive electrode of a power supply through a load resistor, said output source electrode being coupled to a negative electrode of said power supply, said output field effect transistor being made of a metal oxide semiconductor, said output field effect transistor becoming on when an output gate electrode thereof is supplied with a bias voltage;
a reference field effect transistor having a reference source electrode, a reference drain electrode, and a reference gate electrode, said reference drain electrode being positive electrode of said power supply through a reference resistor, said reference source electrode being coupled to said negative electrode of said power supply, said reference field effect transistor being made of a metal oxide semiconductor, said reference field effect transistor becoming on when a reference gate electrode thereof is supplied with said bias voltage;
a comparator having a load input terminal, a reference input terminal, and a compare output terminal, said load input terminal being connected to a load node of said output drain electrode and said load resistor, said reference input terminal being connected to a reference node of said reference drain electrode and said reference resistor, said load node having a load sensing voltage, said reference node having a reference voltage, said comparator comparing said load sensing voltage with said reference voltage to produce a compare output voltage when said load sensing voltage is higher than said reference voltage;
a bias power circuit connected to said output gate electrode, said reference gate electrode, and said signal input terminal for producing said bias voltage when said bias power circuit is supplied with said first level portion of said input voltage and for supplying said bias voltage to said output gate electrode and said reference gate electrode; and
a limiting circuit connected to said compare output terminal, said output gate electrode, and said reference gate electrode for producing and supplying a limiting voltage to said output gate electrode and said reference gate electrode when said limiting circuit is supplied with said compare output volt- age, said limiting voltage being lower than said bias voltage, said output and said reference field effect transistors becoming off when said output and said reference gate electrodes are supplied with said limiting voltage.

2. A switching circuit comprising:

a signal input terminal for receiving an input voltage having a first level portion and a second level portion;

an output field effect transistor having an output source electrode, an output drain electrode, and an output gate electrode, said output drain electrode being connected to a positive electrode of a power supply, said output source electrode being connected to a negative electrode of said power supply through a load resistor, said output field effect transistor being made of a metal oxide semiconductor, said output field effect transistor becoming on when said output gate electrode is supplied with a bias voltage;

a reference field effect transistor having a reference source electrode, a reference drain electrode, and a reference gate electrode, said reference drain electrode being connected to said positive electrode of said power supply, said reference source electrode being connected to said negative electrode of said power supply through a reference resistor, said reference field effect transistor being made of a metal oxide semiconductor, said reference field effect transistor becoming on when said reference gate electrode is supplied with said bias voltage;

a comparator having a load input terminal, a reference input terminal, and a compare output terminal, said load input terminal being connected to a load node of said output source electrode and said load resistor, said reference input terminal being connected to a reference node of said reference source electrode and said reference resistor, said load node having a load sensing voltage, said reference node having a reference voltage, said comparator comparing said load sensing voltage with said reference voltage to produce a compare output voltage when said load sensing voltage is lower than said reference voltage;

a bias power circuit connected to said output gate electrode, said reference gate electrode, and said signal input terminal for producing said bias voltage when said bias power circuit is supplied with said first level portion of said input voltage and for supplying said bias voltage to said output gate electrode and said reference gate electrode; and a limiting circuit connected to said compare output terminal, said output gate electrode, and said reference gate electrode for producing and supplying a limiting voltage to said output gate electrode and said reference gate electrode when said limiting circuit is supplied with said compare output voltage, said limiting voltage being lower than said bias voltage, said output and said reference field effect transistors becoming off when said output and said reference gate electrodes are supplied with said limiting voltage.

3. A switching circuit comprising:

an output field effect transistor having an output source electrode, an output drain electrode, and an output gate electrode, said output drain electrode being connected to a positive electrode of a power supply through a load resistor, said output source electrode being coupled to a negative electrode of said power supply;

a reference field effect transistor having a reference source electrode, a reference drain electrode, and a reference gate electrode, said reference drain electrode being connected to said positive electrode of said power supply through a reference resistor, said reference source electrode being coupled to said negative electrode of said power supply, said reference field effect transistor becoming on when a reference gate electrode thereof is supplied with said bias voltage;

a comparator having a load input terminal, a reference input terminal, and a compare output terminal, said load input terminal being connected to a load node of said output drain electrode and said load resistor, said reference input terminal being connected to a reference node of said reference drain electrode and said reference resistor, said load node having a load sensing voltage, said reference node having a reference voltage, said comparator comparing said load sensing voltage with said reference voltage to produce a compare output voltage when said load sensing voltage is higher than said reference voltage;

a bias power circuit connected to said output gate electrode and said reference gate electrode for supplying said bias voltage to said output gate electrode and said reference gate electrode; and a limiting circuit connected to said compare output terminal, said output gate electrode, and said reference gate electrode for producing and supplying a limiting voltage to said output gate electrode and said reference gate electrode when said limiting circuit is supplied with said compare output voltage, said limiting voltage being lower than said bias voltage.

4. A switching circuit as claimed in claim 3, wherein said output and reference field effect transistors are a metal oxide semiconductor FETs.

5. A switching circuit comprising:

an output field effect transistor having an output source electrode, an output drain electrode, and an output gate electrode for receiving a bias voltage, said output drain electrode being connected to a positive electrode of a power supply, said output source electrode being connected to a negative electrode of said power supply through a load resistor;

a reference field effect transistor having a reference source electrode, a reference drain electrode, and a reference gate electrode for receiving a bias voltage, said reference drain electrode being connected to said positive electrode of said power supply, said reference source electrode being connected to said negative electrode of said power supply through a reference resistor;

a comparator having a load input terminal, a reference input terminal, and a compare output terminal, said load input terminal being connected to a load node of said output source electrode and said load resistor, said reference input terminal being connected to a reference node of said reference source electrode and said reference resistor, said load node having a load sensing voltage, said reference node having a reference voltage, said comparator comparing said load sensing voltage with said reference voltage to produce a compare output voltage when said load sensing voltage is lower than said reference voltage; a bias power circuit connected to said output gate electrode, said reference gate electrode, and a signal input terminal for supplying said bias voltage to said output gate electrode and said reference gate electrode; and a limiting circuit connected to said compare output terminal, said output gate electrode, and said reference gate electrode for producing and supplying a limiting voltage to said output gate electrode and said reference gate electrode when said limiting circuit is supplied with said compare output voltage, said limiting voltage being lower than said bias voltage.

6. A switching circuit as claimed in claim 5, wherein said output and reference field effect transistors are a metal oxide semiconductor FETs.

* * * * *

UNITED STATES PATENT AND TRADEMARK OFFICE
CERTIFICATE OF CORRECTION

PATENT NO. : 5,361,008
DATED : November 1, 1994
INVENTOR(S) : SAIJO

It is certified that error appears in the above-identified patent and that said Letters Patent is hereby corrected as shown below:

Col. 8, line 35, after "being" and insert
--connected to said--.

Signed and Sealed this

Twenty-first Day of February, 1995

Attest:

BRUCE LEHMAN

Attesting Officer    Commissioner of Patents and Trademarks